United States Patent Office 2,773,766

Patented Dec. 11, 1956

2,773,766

LIGHT-SENSITIVE MATERIAL FOR PHOTOMECHANICAL REPRODUCTION AND PROCESS FOR THE PRODUCTION OF IMAGES

Oskar Sus and Karl Möller, Wiesbaden-Biebrich, Germany, assignors, by mesne assignments, to Azoplate Corporation, Summit, N. J., a corporation of New Jersey No Drawing. Application December 7, 1953, Serial No. 396,788

Claims priority, application Germany December 10, 1952

19 Claims. (Cl. 96—33)

The present invention relates to the field of planographic printing. In particular it relates to the use of aromatic ortho-nitro-formyl compounds as light-sensitive substances and to the process of making printing plates from light-sensitive material consisting of a base and a light-sensitive layer containing said aromatic ortho-nitro-formyl compounds as light-sensitive substances.

In order to simplify and to improve the operation of photomechanical reproduction processes as well as the preparation of the light-sensitive material used therein, attempts have been made for some time to replace the chromic acid salts hitherto used in the light-sensitive layers by other light-sensitive substances. For example, this has been done recently by the application of water-insoluble diazo compounds which belong to the group of ortho-quinone-diazides. Considerable improvements have recently been achieved in the fabrication of storageable light-sensitive material, which may very successfully be used for making printing plates for the different printing processes, for example, planographic printing and planographic offset printing and for making clichés and stencils. Such light-sensitive material includes a base or a support which carries a light-sensitive coating. The light-sensitive coating must contain a substance which initially, or after exposure to actinic light accepts greasy ink.

It is an object of the present invention to provide a new light-sensitive material which may be used for the photomechanical production of contrasts and the manufacture of copies. Another object of this invention is to provide printing plates in which the light-sensitive material consists of a support provided with a layer which substantially consists of aromatic ortho-nitro-formyl compounds as the light-sensitive substance. Other objects and advantages of this invention will become apparent from a reading of the description following hereinafter.

The ortho-nitro-formyl compounds to be used in accordance with this invention may have other substituents linked to the ring of such compounds. For instance, the presence of groups which cause a considerable enlargement of the molecule and thus a reduction of the water-solubility of the ortho-nitro-formyl compound have proven to be of advantage. Aromatic ortho-nitro-aldehydes containing acylated hydroxyl groups as substituents in their molecules have proved to be especially well suited, and among these compounds those which are outstanding have the constitution of di-esters of dibasic acids with aromatic oxy-o-nitro-aldehydes. Light-sensitive material that contains these compounds in the light-sensitive layer may be used for the production of printing plates which are highly resistant to mechanical damaging in the printing apparatus. These kinds of substituents also exert a good influence on the light-sensitivity of the compounds. The presence of a second nitro group in a neighboring position to the aldehyde group causes a considerable improvement of the light-sensibility. Such substituents are to be excluded, however, which render the aromatic o-nitro-aldehydes water-soluble.

The light-sensitive material is prepared by whirl-coating or spraying onto a suitable support a 0.5–3% solution of the aromatic ortho-nitro-aldehydes in an organic solvent or mixture of solvents, the solvent being removed by thorough drying. Among the supports, metal plates or metal foils are preferred, e. g. sheet aluminum or zinc. It is advantageous to use solvents which are readily volatile for the solution with the light-sensitive substances according to the present invention. After coating and drying the solution, the light-sensitive substance remains on the surface of the layer support as a thin, water-repellent film. The light-sensitive article thus produced has very good storage ability.

The light-sensitive material, i. e. the base coated with the aromatic o-nitro-aldehyde according to the present invention, may be used for the production of images by exposing the light-sensitive surface of the support to the action of actinic light-rays under a transparent original. As the exposure time may vary depending on the special aromatic o-nitro-aldehyde used, it is advantageously predetermined in very single case by exposure under a photometric step wedge. With an arc-lamp such as is customarily used in the art the exposure-time will usually be between 4 to 8 minutes.

After exposure to a light image the exposed plates are treated with a weakly alkaline solution, for example, a low percentage aqueous solution of secondary or tertiary alkali or ammonium salts of phosphoric acid. This treatment is hereinafter referred to as "development of the image." Those areas of the light-sensitive coating which are struck by light are hereinafter referred to as the "non-imaged areas." In the "non-imaged areas," the aromatic o-nitro-aldehydes are converted into nitroso-carboxylic acids (see Ciamician and Silber, "Berichte der deutschen chemischen Gesellschaft," vol. 34 (1901), page 2040) and are then dissolved by the treatment with alkaline solutions. In those parts of the layer not struck by light hereinafter referred to as "imaged areas," the nitro-aldehyde remains. Since the aromatic o-nitro-aldehydes are oleophilic, greasy ink, when applied to the exposed and developed layer adheres only to those parts which were not struck by light, i. e. the "imaged areas." Thus, a positive colored image is obtained from a positive pattern while the background is hydrophilic, and the resulting "imaged areas" may be used as the printing surface. In this case, it may be advantageous to submit the light-sensitive layer side of the support to a short treatment with dilute solutions of acid reacting substances preferably phosphoric acid, after the development of the image and prior to inking with greasy ink, in order to cleanse the background of the image and render it more hydrophilic. Hereinafter when the term "acid reacting substances" is used, it is intended to include solutions containing acids and/or acid salts. If, instead of phosphoric acid, nitric acid or other acids are used, which are known as etching means in the printing art, elevated images, or so-called clichés, may be obtained from the printing forms produced.

Certain substances may be added to the solutions of aromatic o-nitro-formyl compounds used for coating the base support, which promote the formation of a uniform layer and at the same time, improve its hydrophobic character. Such substances as alkali-soluble resins which are also soluble in organic solvents, are advantageously used for this purpose, as for example, formaldehyde phenol resins, colophony or shellac.

In order to make the image more distinctly visible while it is being developed, dyestuffs (preferably such as are soluble in organic solvents) may be added to the sensitizing solution. Azo dyes which contain in their molecules hydroxyl groups or a carboxyl group have proved to be of special advantage in this connection. Dye stuffs belonging to the triphenyl-methane series also yield good results. If the latter are used for the purpose of the invention it is not necessary that they contain groups which render them alkali-soluble, because owing to an affinity between the dyestuffs of the triphenyl-methane series and the aromatic o-nitro-aldehydes of the present invention, the dyestuff sticks to the image areas while in the non-imaged areas the dye is removed through the alkaline developing process together with the light-decomposition products of the light-sensitive substance.

It may be advantageous to use the aromatic o-nitro-aldehydes either in mixture with each other or with other light-sensitive substances suitable for photomechanical reproduction of positive images from positive patterns, in order to inhibit crystallization of the light-sensitive layer during storage. Water-insoluble diazo compounds of the ortho-quinone-diazide series, are, for instance, well suited for this purpose, in particular their sulfonic acid and carboxylic acid esters and amides.

The light-sensitivity of the layers may be favorably influenced by adding sensitizing agents to the solutions, e. g. thiosin-amine or eosin. The sensitizing agents may be added only in limited quantities so as not to impede the development of the image.

The following examples are inserted in order to illustrate the present invention. They are not intended to thereby restrict the scope of the invention to the subject matter disclosed in the examples.

*Example 1*

A 2% solution of the di-ester of phthalic acid and 3-formyl-4-nitro-phenol [bis-(3-formyl-4-nitrophenyl)-phthalate] (Formula 1)

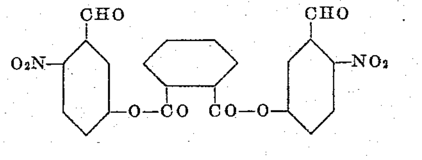

in a solvent mixture consisting of one part by volume of di-methyl formamide and 3 parts by valume of glycol monomethyl ether is whirlcoated onto a mechanically roughened aluminum foil. The foil is then dried for a short period and then, in order to remove the remaining solvent, thoroughly dried for 5 minutes at a temperature of 90° C. The foil thus sensitized is thereafter exposed for 5 to 6 minutes to the light of an arc lamp under a transparent pattern, the arc lamp being for instance of 18 amp. and at a distance from the pattern of about 70 cm. To develop the positive image thus produced the exposed layer is swabbed with a 15% solution of disodium phosphate, whereupon the image becomes clearly visible on the metallic background. If the foil is to be used as a printing plate, it is wiped over with a 1% solution of phosphoric acid and subsequently inked with greasy ink.

Instead of a 15% solution of disodium phosphate, also a 10% soda solution or a 15% solution of tri-ammonium phosphate may be used as a developing agent.

Bis-(3-formyl-4-nitro-phenyl)-phthalate (corresponding to Formula 1) is prepared by vigorously shaking equivalent quantities of 2-nitro-5-hydroxy-benzaldehyde, phthaloylchloride and a 5% soda solution in dioxane. A crystalline precipitate results which, after recrystallization from glacial acetic acid, melts at 184–185° C.

*Example 2*

A paper foil prepared according to U. S. Patent No. 2,534,588, which is coated on one side with a layer consisting of casein and kaolin, the layer being hardened with formaldehyde, is coated with a light-sensitive solution which contains 1 part by weight of the compound corresponding to Formula 1 and 0.125 part by weight of shellac, dissolved in 100 parts by volume of the solvent mixture described in Example 1. After drying, the coated side of the foil is exposed to light under a positive, transparent pattern as described in Example 1, and the image is developed by means of a 5% disodium phosphate solution. The exposed side of the layer is subsequently treated with a solution which contains about 2% of primary ammonium phosphate, 1% of nickel nitrate, 5% of glycerin and 0.5% of phosphoric acid, and then inked with greasy ink. Thus a colored positive image is obtained which may be used as a printing plate.

If, instead of a paper foil, a zinc plate is used as a support, it will be necessary to cleanse the surface of the plate with an acetic acid solution of potassium alum (100 g. of water, 4 g. of glacial acetic acid, and 4 g. of potash alum) before coating the plate, and the sensitizing solution must contain 5% of the compound according to Formula 1. After development, the image is treated with a solution of acid salts, as described, for example, in German Patent No. 642,782.

*Example 3*

1 part by weight of the di-ester of 3-formyl-4-nitrophenol and carbonic acid [bis-(3-formyl-4-nitrophenyl)-carbonate]

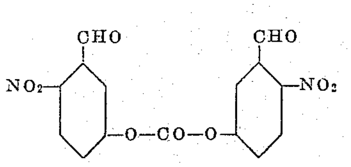

is dissolved in a mixture consisting of 25 parts by volume of dimethyl formamide and 75 parts by volume of glycol monomethyl ether, and 0.2 part by weight of "Alnovol" (trade-mark registered in Germany, a phenol-formaldehyde novolak manufactured and traded by the company Chemische Werke Albert of Wiesbaden-Biebrich, Germany) are added to said solution, which is then whirlcoated as described in Example 1 onto a mechanically roughened aluminum foil. After thorough drying, an image is produced on the foil in known manner by exposing the light-sensitive surface under a pattern. The image is developed first with a 1% and then with a 3% solution of trisodium phosphate. A printing plate may be produced from the foil thus treated by following the directions given in Example 1.

The compound corresponding to Formula 2 is prepared according to the directions given by F. A. Mason in "Journal of the Chemical Society," vol. 127 (1925), page 1198. Equally good results are obtained if, instead of the compound corresponding to Formula 2, the compound corresponding to Formula 3

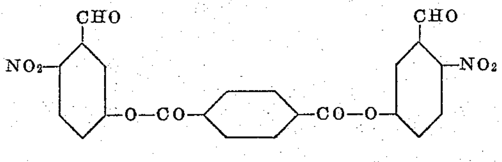

[bis-(3-formyl-4-nitro-phenyl)-terephthalate] is used. In this case, the solvent mixture should be richer in dimethyl formamide, because the compound corresponding to Formula 3 is more difficultly soluble. Said compound is prepared analogously to the method described in Example 1 from 2-nitro-5-hydroxy-benzaldehyde and terephthalic acid chloride. After recrystallization from glacial acetic acid, the compound melts at 236° to 237° C.

*Example 4*

A solution in which 1 part by weight of bis-(2-methoxy-

3 - nitro - 4 - formyl-phenyl)-carbonate (corresponding to Formula 4)

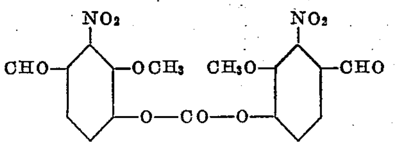

and 0.2 part by weight of the phenol-formaldehyde novolak "Alnovol" (see Example 3) are dissolved in 100 parts by volume of dioxane, is whirlcoated onto a mechanically roughened aluminum foil. The foil is then dried, first with warm air, and then for 5 minutes at a temperature of 90° C. The foil is then exposed under a positive transparent pattern and developed by swabbing first with a 10% and then with a 15% solution of disodium phosphate. After wiping over with a 1% solution of phosphoric acid, a distinctly visible positive image of the pattern is obtained which may be inked with greasy ink and serve as a printing plate, or may be used for making stencils.

The compound corresponding to Formula 4 is prepared analogously to the compound corresponding to Formula 2 by reaction of phosgene with 2-nitro-vanillin. After recrystallization from benzene, to which a small quantity of gasoline has been added, the compound melts at a temperature of about 120° to 124° C.

*Example 5*

An aluminum foil which is superficially roughened by means of a sand blast machine is coated with a solution, which consists of 0.5 part by weight of bis-(2,4-dinitro-3-formyl-6 - methoxy - phenyl) - terephthalate according to Formula 5,

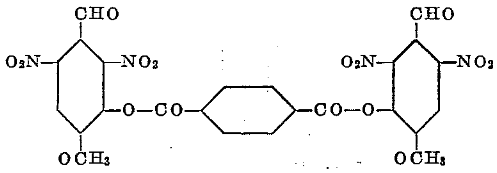

and 0.1 part by weight of "Alnovol" (see Example 3), dissolved in a mixture of 25 parts by volume of dimethyl formamide and 75 parts by volume of glycol-monomethyl ether. The foil is then thoroughly dried. To produce a positive image of a positive transparent pattern, an exposure time of 2.5 to 3 minutes under an arc lamp is necessary. By developing with a 20% aqueous solution of triethanol-amine a positive image is obtained which is ready for use. When used as a printing plate it exhibits a high resistance to stress in the printing machines.

The compound corresponding to Formula 5 is prepared from dinitro-iso-vanillin and terephathalic acid chloride analogously to the method described in Example 1. After recrystallization from glacial acetic acid, the compound melts at 258° C. under spontaneous decomposition.

*Example 6*

An aluminum foil is coated with a glycol-monoethyl ether solution which contains 1% of the 3-formyl-4-nitro-phenyl-(1)-benzoic acid ester (corresponding to Formula 6)

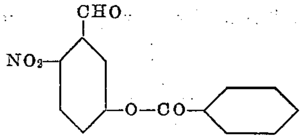

and 0.1% of "Alnovol" (see Example 3). In order to produce a positive image, which, after being wiped over with greasy ink may be used for printing, the light-sensitive layer is exposed to the light of an arc lamp for about 6 minutes under a transparent pattern. It is then developed with a 3–5% solution of trisodium phosphate and submitted to an aftertreatment by wiping over with a 1% solution of phosphoric acid. The same results are obtained by using the compound corresponding to Formula 7

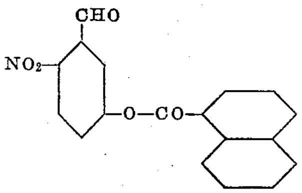

the 3-formyl-4-nitro-phenyl-(1)-α-naphthoic acid ester, instead of the compound corresponding to Formula 6; in this case, exposure time will be 8 to 10 minutes.

The compound corresponding to Formula 6 is prepared according to the directions given by Friedlander and Schenk in "Berichte der deutschen chemischen Gesellschaft," vol. 47 (1914), page 3044. The compound corresponding to Formula 7 is prepared by shaking 1 mol of 2-nitro-5-hydroxy-benzaldehyde, dissolved in some pyridine, with the same quantity of α-naphthoyl-chloride. For purification, the condensation product is treated after precipitation with a soda solution and then recrystallized from a solvent mixture containing dioxane and alcohol. Its melting point lies between 159°–160° C.

*Example 7*

A 1% solution of the 3-formyl-4-nitro-phenyl-(1)-p-chloro benzoic acid ester corresponding to Formula 8

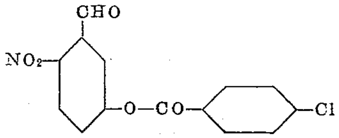

in glycol monomethyl ether is whirlcoated onto an anodically oxidized aluminum foil and the foil is then well dried. By exposing the light-sensitive layer for 7 to 8 minutes under a transparent positive pattern, an image may be produced which is developed analogously to the directions given in Example 6 and which excels by its good greasy ink receptivity. A foil thus treated is well suited to be used as a printing plate in offset printing. The compound corresponding to Formula 8 is prepared analogously to the compound of Formula 6.

*Example 8*

In a solvent mixture containing 25 parts by volume of dimethyl-formamide and 75 parts by volume of glycol-monomethyl ether, the following substances are dissolved:

1 part by weight of the di-ester of naphthalene-2,6-disulfonic acid and of 3-formyl-4-nitro-phenol (naphthalene - 2,6 - bis - [3' - formyl - 4' - nitro - phenyl - (1)-sulfonic acid ester], corresponding to Formula 9)

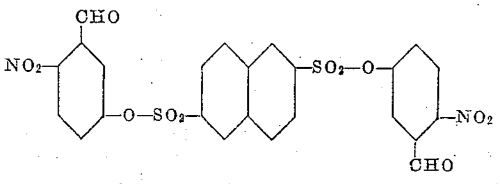

0.5 part by weight of "Almoval" (see Example 3), 0.1 part by weight of Eosin S (see: Schulz, "Farbstofftabellen," 7th edition, vol. 1, No. 883). An aluminum foil is sensitized with this solution. The well dried foil is exposed for 8 minutes under a positive transparent pattern and developed by means of a 1–3% solution of trisodium phosphate. The foil, which now shows an image of the pattern in a dull red color, may be used for the production of stencils.

To prepare the compound corresponding to Formula 9, 2 moles of 2-nitro-5-hydroxy-benzaldehyde are dissolved in an equivalent quantity of dilute caustic soda lye and 1 mol of finely powdered naphthalene-2,6-disulfonic acid chloride is suspended in this solution. The reaction mixture is kept standing at room temperature for 2 days.

Thus an ester is formed which is drawn off and washed first with a soda solution and then with water. After recrystallization from glacial acetic acid the compound melts at a temperature of 193° to 194° C.

*Example 9*

An aluminum foil is coated with a dioxane solution which contains 0.5% each of the compounds corresponding to Formula 10 (p-toluol-[3-formyl-4-nitro-phenyl-(1)]-sulfonic acid ester)

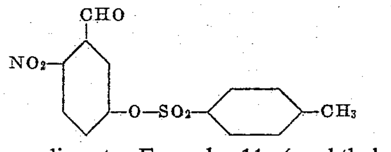

and corresponding to Formula 11 (naphthalene-β-[3-formyl-4-nitro-phenyl-(1)]-sulfonic acid ester),

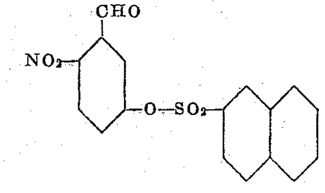

as well as 0.2% of "Alnovol" (see Example 3). The positive image which is obtained by exposing the light-sensitive foil under a transparent India ink drawing is developed by means of a 3–5% trisodium phosphate solution and made ready for printing in a per se known manner.

The compound corresponding to Formula 10 is prepared following the directions given by P. Friedlander and O. Schenk in "Berichte der deutschen chemischen Gesellschaft," vol. 47 (1914), page 3044. The compound corresponding to Formula 11 is prepared analogously.

*Example 10*

An aluminum foil which has been sensitized by a solution containing 1 part by weight of 3-nitro-4-formyl-diphenyl-sulfone corresponding to Formula 12

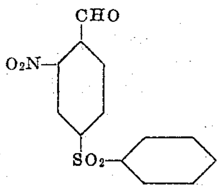

and 0.2 part by weight of colophony, dissolved in 100 parts by volume of dioxane, is exposed to light for 4 to 5 minutes under a paper or cardboard stencil. The exposed foil is developed by means of a 20% aqueous solution of triethanol amine, whereupon a positive image becomes clearly visible on the metal support. It may be punched out in order to obtain a true metal stencil reproduction of the original. Equally good results are obtained when, instead of the compound corresponding to Formula 12, the compound corresponding to Formula 13

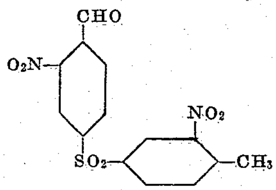

(3,3′-dinitro-4-formyl-4′-methyl-diphenyl sulfone) is used.

The compound corresponding to Formula 12 is prepared according to the directions given by L. Chardonnens and J. Venetz in "Helvetica Chimica Acta," vol. 22 (1939), page 860. To prepare the compound corresponding to Formula 13, equivalent quantities of 4,4′-dimethyl-3,3′-dinitro-diphenyl-sulfone and p-nitroso-dimethyl-aniline are condensed, and the azomethine compound obtained in the course of the reaction is saponified with hydrochloric acid (see "Helvetica Chimica Acta," vol. 22 (1939), page 864).

*Example 11*

An ethyl-methyl-ketone solution which contains 1% of the compound corresponding to Formula 12 and 0.1% of the sulfonic acid ester formed of naphtho-quinone-(1,2)-diazide-(2)-5-sulfonic acid and 7′-hydroxy-2-carboxethyl-naphtho-1′,2′:4,5-imidazole corresponding to the Formula 14

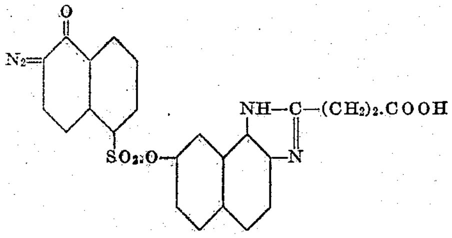

is whirlcoated onto an aluminum foil and dried with warm air. The light-sensitive foil is exposed for 6 minutes to the light of an arc lamp under a transparent pattern. The positive image thus produced on the light-sensitive layer is developed by means of a 3% solution of trisodium phosphate and may easily be inked with greasy ink.

*Example 12*

A dioxane solution which contains 2% of 6-nitro-piperonal corresponding to Formula 15

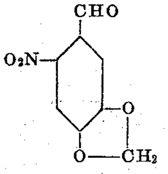

and 0.2% of "Alnovol" (see Example 3) is whirlcoated in known manner onto an aluminum foil. After drying with warm air, an image is produced on the light-sensitive foil by exposing for 5–6 minutes under a positive transparent pattern. This image (a positive image from a positive pattern) is developed by means of a 3–5% solution of trisodium phosphate and may, after a short treatment with dilute phosphoric acid, be inked with greasy ink. 6-nitro-piperonal is prepared following the directions given by F. Haber in "Berichte der deutschen chemischen Gesellschaft," vol. 24 (1891), page 624.

*Example 13*

An aluminum foil is sensitized with a glycol-monomethyl ether solution which contains 1% of o-nitrobenzaldehyde corresponding to Formula 16

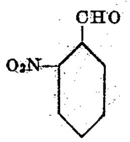

1% of nitro-acetyl-vanillin corresponding to Formula 17

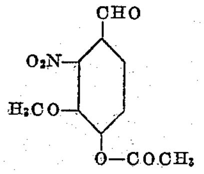

and 0.2% of "Alnovol" (see Example 3). After thorough drying with warm air, the foil is exposed under a positive transparent pattern and developed with a 3% trisodium phosphate solution. Thus a positive image of the pattern is obtained. After cleaning the background by an after-treatment of the developed foil with a solution containing 1% of phosphoric acid, 8% of dextrine and 1% of formaldehyde, the image may be inked with greasy ink.

*Example 14*

A 1% solution of 1-nitro-2-naphthaldehyde corresponding to Formula 18

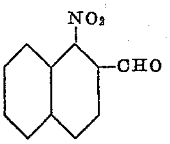

in glycol-monomethyl ether is coated onto a mechanically roughened aluminum foil by means of a platewhirler. Subsequently, the coated foil is dried first briefly with warm air and then for about 5 minutes at a temperature of 90° C. The foil thus sensitized is then exposed to the light of an arc lamp of 18 amps. under a positive transparent pattern, at a distance from the pattern of 70 cm., and with an exposure time of 3 minutes. In order to develop the positive image produced, the exposed foil is swabbed with a 5% solution of trisodium phosphate and then briefly wiped over with a 1% phosphoric acid solution. The image is then inked with greasy ink in order to use it as a printing form.

1-nitro-2-naphthaldehyde corresponding to Formula 18 is prepared following the directions given by F. Mayer and T. Oppenheimer in "Berichte der deutechen chemischen Gesellschaft," vol. 51 (1918), page 1241.

*Example 15*

An aluminum foil is light-sensitized by coating with a solution, in which 1% of 3,3'-dinitro-4-formyl-benzophenone corresponding to Formula 19

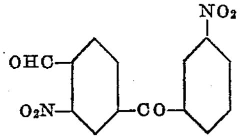

is dissolved in a solvent mixture consisting of 25 parts by volume of dimethyl formamide and 75 parts by volume of glycol-monomethyl ether. After drying, the foil is exposed to the light of an arc lamp under a transparent, type-written pattern. Exposure time 8–10 minutes. In order to develop the positive image produced on the light-sensitive layer, the exposed foil is swabbed with a 2–3% solution of trisodium phosphate. After being subsequently wiped over with a 1% phosphoric acid solution, the foil may be inked with greasy ink and used as a printing plate.

The 3,3'-dinitro-4-formyl-benzophenone is prepared by first producing, following the directions given by L. Chardonnens in "Helvetica Chimica Acta," vol. 22 (1939), page 828, from 3,3'-dinitro-4-methyl-benzophenone and p-nitroso-dimethyl-aniline the respective azomethine compound. Then to obtain the formyl compound, the azomethine compound is split up. The splitting up is accomplished in a benzene solution with about an 18% solution of hydrochloric acid, according to the method stated in "Helvetica Chimica Acta," vol. 16, page 1299. After recrystallization from glacial acetic acid, 3,3'-dinitro-4-formyl-benzophenone melts at about 139°–140° C.

*Example 16*

A glycol monomethyl ether solution which contains 1% of 3-nitro-4-formyl-benzophenone corresponding to Formula 20

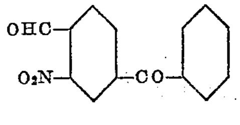

and 0.2% of "Alnovol" (see Example 3) is whirlcoated onto a mechanically roughened aluminum foil and the foil is then dried with warm air. The sensitized foil is then exposed for 6 minutes to the light of an arc lamp under a transparent, positive pattern. The image thus produced on the light-sensitive layer is developed by means of a 0.5% solution of trisodium phosphate. The plate is made ready for printing as described in Example 15.

The 3-nitro-4-formyl-benzophenone may be prepared following the directions given by L. Chardonnens in "Helvetica Chimica Acta," vol. 16 (1933), page 1299 et seq.

*Example 17*

An aluminum foil sensitized with a solution which contains in 100 parts by vol. of glycol monomethyl ether, 1 part by weight of 3-nitro-4-formyl-azobenzene corresponding to Formula 21

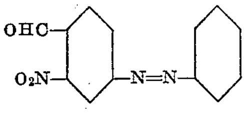

and 0.2 part by weight of the phenol formaldehyde novolak mentioned in Example 3, is exposed for 5 minutes to the light of an arc lamp under a positive transparent pattern. The exposed foil is then developed by means of a 20% aqueous solution of triethanol amine. A positive image is obtained which, after being inked with greasy ink, may be used as a printing plate.

The 3-nitro-4-formyl-azobenzene is prepared according to the directions given by L. Chardonnens and P. Heinrich in "Helvetica Chimica Acta," vol. 23 (1940), pp. 1409 and following.

*Example 18*

1 part by weight of the compound corresponding to Formula 22

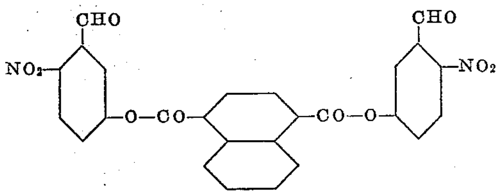

and 0.2 part by weight of shellac are dissolved in 50 parts by volume of dimethyl formamide by heating them in a water-bath, and then 50 parts by volume of glycol-monomethylether are added to the solution. On a plate-whirler a mechanically roughened aluminum foil is coated with the thus obtained solution and after a short period of drying with hot air, drying is continued for 5 minutes at a temperature of 90° C., in order to obtain the complete removal of the solvents. Then the sensitized foil is exposed for 4–5 minutes to the light of an arc-lamp, under a film-diapositive. The development of the positive image is effected by swabbing the exposed layer with a 1% trisodiumphosphate solution. The positive image is then distinctly visible on the metallic background. Before using the aluminum foil covered with the positive image of the pattern as a printing plate it is swabbed with very dilute phosphoric acid (about 1%) and inked with greasy ink.

To prepare the compound corresponding to Formula 22 2 moles of 2-nitro-5-hydroxy-benzaldehyde are condensed with 1 mole of naphthalene-1,4-dicarboxylic-acid-dichloride in a dioxane solution in the presence of 2 moles of pyridine. The crude reaction product obtained is purified, by dissolving it in dimethylformamide and precipitating it by adding water to the solution; the thus purified product melts at a temperature of 216–217° C.

What we claim as our invention is:

1. A presensitized lithographic printing plate comprising a flexible sheet-like base of a material selected from the group consisting of aluminum, zinc and papers coated with a coating composition comprising mineral filler and adhesive, said base having a hydrophilic surface, a thin uniform layer coated on said surface of a light sensitive material including an ortho-nitro-formyl compound selected from the group consisting of ortho-nitro-aldehydes of the benzene and naphthalene series.

2. The article of claim 1 wherein said compound includes acylated hydroxyl groups as substituents in the molecule.

3. A presensitized lithographic printing plate comprising a flexible sheet-like base of a material selected from the group consisting of aluminum, zinc and papers coated with a coating composition comprising mineral filler and adhesive, said base having a hydrophilic surface, a thin uniform layer coated on said surface of an oleophilic material including a compound selected from the group consisting of

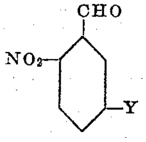

and

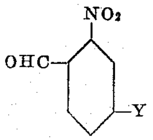

wherein Y stands for an acylated hydroxyl group.

4. The article of claim 3 wherein Y is a hydroxyl group acylated by a di-basic acid.

5. The article of claim 4 wherein Y is a hydroxyl group acylated by phthalic acid.

6. A presensitized lithographic printing plate comprising a flexible sheet-like base of a material selected from the group consisting of aluminum, zinc and papers coated with a coating composition comprising mineral filler and adhesive, asid base having a hydrophilic surface, a thin uniform layer coated on said surface of an oleophilic material including

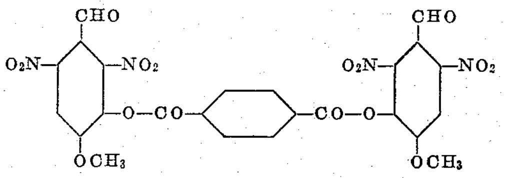

7. A presensitized lithographic printing plate comprising a flexible sheet-like base of a material selected from the group consisting of aluminum, zinc and papers coated with a coating composition comprising mineral filler and adhesive, said base having a hydrophilic surface, a thin uniform layer coated on said surface of an oleophilic material including

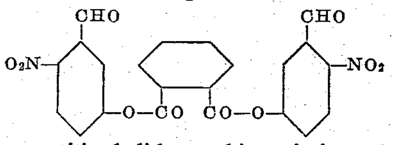

8. A presensitized lithographic printing plate comprising a flexible sheet-like base of a material selected from the group consisting of aluminum, zinc and papers coated wtih a coating composition comprising mineral filler and adhesive, said base having a hydrophilic surface, a thin uniform layer coated on said surface of an oleophilic material including

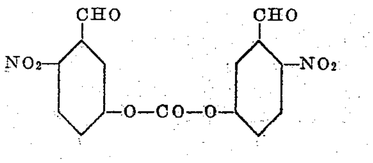

9. A presensitized lithographic printing plate comprising a flexible sheet-like base of a material selected from the group consisting of aluminum, zinc and papers coated with a coating composition comprising mineral filler and adhesive, said base having a hydrophilic surface, a thin uniform layer coated on said surface of an oleophilic material including

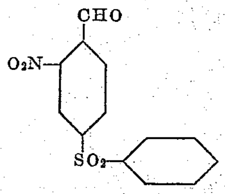

10. A presensitized lithographic printing plate comprising a flexible sheet-like base of a material selected from the group consisting of aluminum, zinc and papers coated with a coating composition comprising mineral filler and adhesive, said base having a hydrophilic surface, a thin uniform layer coated on said surface of an oleophilic material including

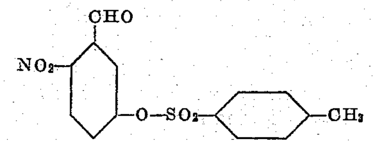

11. The process for forming plates for use in photomechanical reproduction comprising the steps of coating a sheet-like base with a light sensitive thin uniform layer including an ortho-nitro-formyl compound of the group consisting of ortho-nitro-aldehydes of the benzene and naphthalene series, exposing said light-sensitive layer to a light image to decompose said layer in the light struck areas and treating the exposed layer with a dilute alkaline solution to remove the decomposition products in the light struck areas.

12. The process of claim 11 wherein the developed plate is thereafter treated with a solution containing an acid reacting substance.

13. The process for forming plates for use in photomechanical reproduction comprising the steps of coating a sheet-like base with a light-sensitive thin uniform layer including a compound selected from the group consisting of

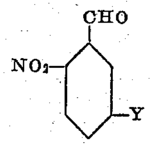

and

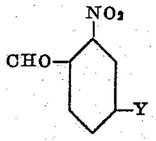

wherein Y is an acylated hydroxyl group, exposing said light sensitive layer to a light image to decompose said layer in the light struck areas and treating the exposed layer with a dilute alkaline solution to remove the decomposition products in the light struck areas.

14. The process for forming plates for use in photomechanical reproduction comprising the steps of coating a sheet-like base with a light-sensitive thin uniform layer including an orthonitro-formyl compound of the group consisting of ortho-nitro-aldehydes of the benzene and naphthalene series and a water insoluble diazo compound of the group consisting of sulfonic acid and carboxylic acid esters and amides of an ortho-quinone-diazide, exposing said light-sensitive layer to a light image to decompose said layer in the light struck areas and treating the exposed layer with a dilute alkaline solution to remove the decomposition products in the light struck areas.

15. The process for forming plates for use in photomechanical reproduction comprising the steps of coating a sheet-like base with a light sensitive thin uniform layer including

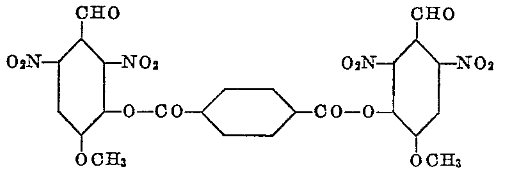

exposing said light-sensitive layer to a light image to decompose said layer in the light struck areas and treating the exposed layer with a dilute alkaline solution to remove the decomposition products in the light struck areas.

16. The process for forming plates for use in photomechanical reproduction comprising the steps of coating a sheet-like base with a light sensitive thin uniform layer including

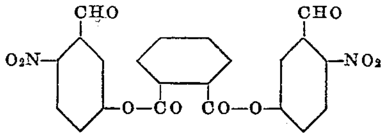

exposing said light sensitive layer to a light image to decompose said layer in the light struck areas and treating the exposed layer with a dilute alkaline solution to remove the decomposition products in the light struck areas.

17. The process for forming plates for use in photomechanical reproduction comprising the steps of coating a sheet-like base with a light sensitive thin uniform layer including

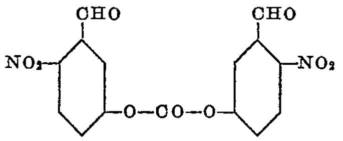

exposing said light sensitive layer to a light image to decompose said layer in the light struck areas and treating the exposed layer with a dilute alkaline solution to remove the decomposition products in the light struck areas.

18. The process for forming plates for use in photomechanical reproduction comprising the steps of coating a sheet-like base with a light sensitive thin uniform layer including

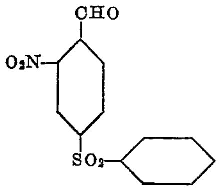

exposing said light sensitive layer to a light image to decompose said layer in the light struck areas and treating the exposed layer with a dilute alkaline solution to remove the decomposition products in the light struck areas.

19. The process for forming plates for use in photomechanical reproduction comprising the steps of coating a sheet-like base with a light sensitive thin uniform layer including

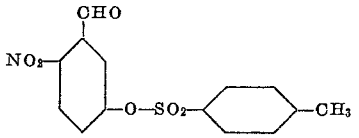

exposing said light sensitive layer to a light image to decompose said layer in the light struck areas and treating the exposed layer with a dilute alkaline solution to remove the decomposition products in the light struck areas.

References Cited in the file of this patent

FOREIGN PATENTS

| | | |
|---|---|---|
| 401,898 | Great Britain | Nov. 23, 1933 |
| 145,850 | Austria | May 25, 1936 |
| 173,402 | Austria | Dec. 27, 1952 |

OTHER REFERENCES

Mason: "Journal of the Chemical Society" (London), vol. 127 (1925), page 1198. (Copy in Scientific Library.)